United States Patent [19]
Shirk et al.

[11] 3,954,570
[45] May 4, 1976

[54] SENSITIZED POLYIMIDES AND CIRCUIT ELEMENTS THEREOF

[75] Inventors: Albert Shirk, Palmyra, Pa.; Myron Ceresa, Advance, N.C.

[73] Assignee: AMP Incorporated, Harrisburg, Pa.

[22] Filed: Nov. 11, 1974

[21] Appl. No.: 522,807

[52] U.S. Cl. ............................ 204/15; 204/30; 204/38 B; 427/98; 427/223; 427/225; 427/282; 427/306; 118/47; 118/504
[51] Int. Cl.² ............................................ C23C 3/02
[58] Field of Search ............ 117/47 A, 46 FC, 212, 117/213, 93 CD, 47 H; 427/223, 225, 282, 98, 306; 204/38 B, 30; 118/47, 504

[56] References Cited
UNITED STATES PATENTS

| | | | |
|---|---|---|---|
| 3,436,468 | 4/1969 | Haberecht | 427/98 |
| 3,767,538 | 10/1973 | Politycki | 117/47 A |
| 3,791,848 | 2/1974 | DeAngelo | 117/47 A |
| 3,791,939 | 2/1974 | Ferrara et al. | 117/212 X |
| 3,853,587 | 12/1974 | Haskell et al. | 117/47 H |

Primary Examiner—Ralph S. Kendall
Assistant Examiner—John D. Smith
Attorney, Agent, or Firm—Russell J. Egan

[57] ABSTRACT

A process for preparation of an activated or sensitized polyimide polymer, deposition of various catalysts on the sensitized polymer and subsequent plating on said sensitized and catalyzed surface of a metal, e. g., nickel, cobalt, copper, or gold from an electroless bath; improved adhesion, avoidance of blistering, etc. are observed; the process is capable of producing useful printed circuits such as for mounting integrated circuit chips.

15 Claims, 2 Drawing Figures

U.S. Patent  May 4, 1976  3,954,570
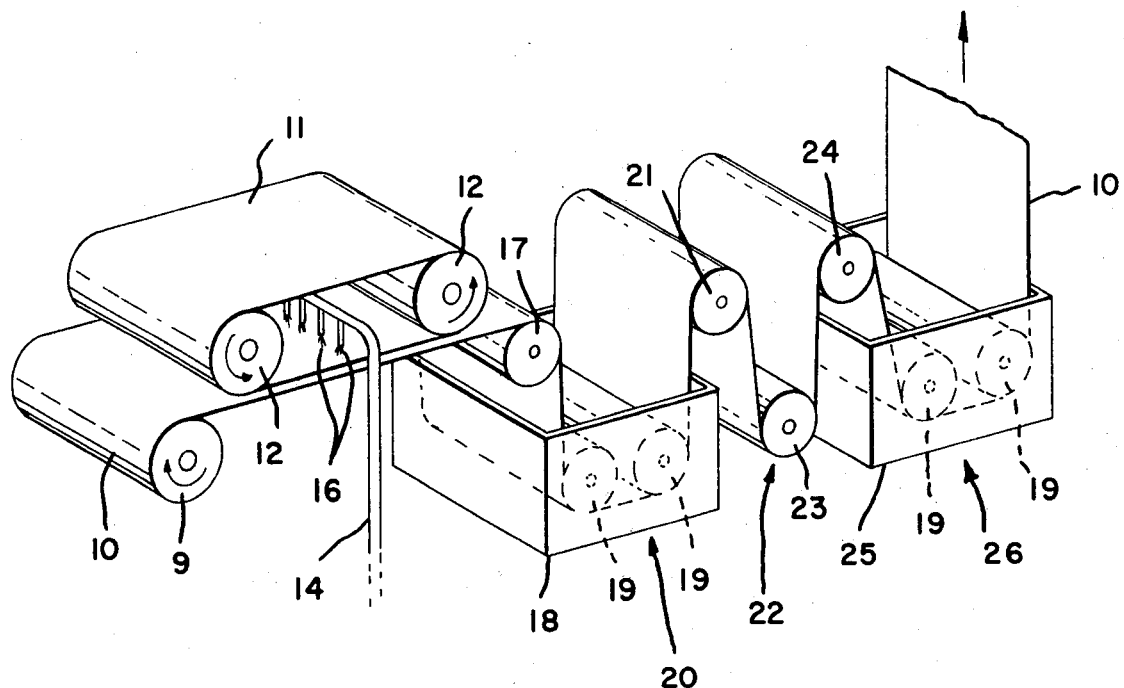
_Fig. 1_
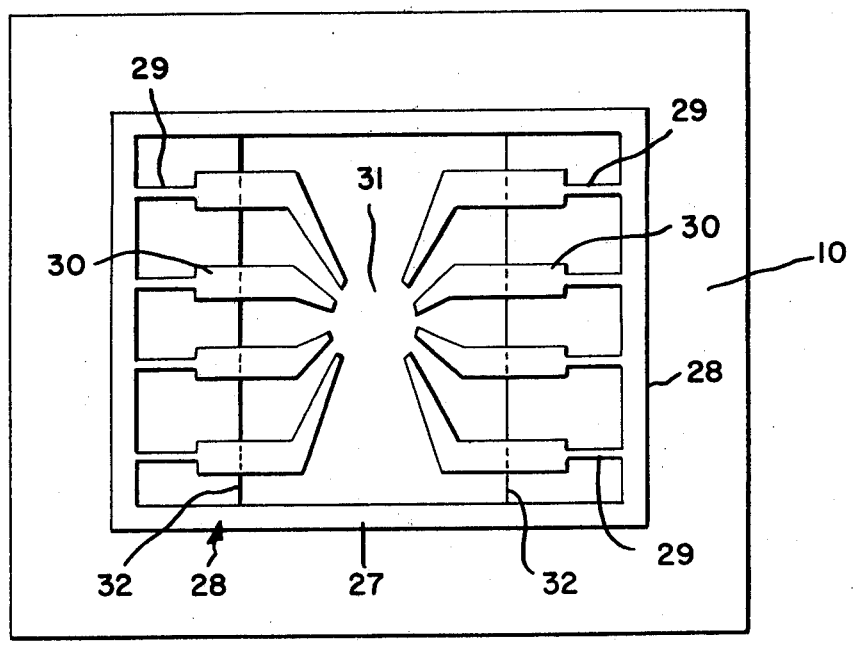
_Fig. 2_

SENSITIZED POLYIMIDES AND CIRCUIT ELEMENTS THEREOF

This invention relates to a process for sensitizing a polyimide film whereby the same can then be catalyzed in certain exposed areas to accept metals which are suitable for deposition from an electroless bath; more particularly, this invention relates to a process whereby polyimide polymer may be sensitized by means of a flame, the flame sensitized areas exposed to a catalytic solution and thereby catalyzed, for receiving a metal from an electroless bath. The sensitized polyimide film is within the scope of this invention as are the products from the catalysis and electroless deposition steps.

BACKGROUND OF THE INVENTION

In the preparation of organic surfaces used as support means for printed or multipath circuits, numerous problems are encountered, such as adhesion of the metallic outline of the printed circuit to the substrate, blistering of the metallic deposit and line definition as well as stability of the organic surface. Still further, when an electrolessly deposited metal is used as a conductive layer for additional deposition of a metal such as by electrolytical deposition, the adhesion between the substrate, the electroless deposition, and the electrolytically deposited metal must be sufficiently strong. The reliability of these circuits must be especially outstanding such as for integrated circuits accepting integrated chips especially when these are bonded to the substrate.

PRIOR ART

Means for obtaining a sensitized surface are disclosed in the prior art such as U.S. Pat. No. 3,562,005, which illustrates the general background for the prior art as well as the surface cleaning and sensitization of a surface by catalyst solutions for acceptance of a metal from an electroless bath. The prior art has been based on how a polyimide film may be sensitized by a deposition of a sensitizing solution, but it is silent on how a polyimide polymer, because of the inherent nature of the polymer, can be utilized for obtaining catalytically active sites as a reaction between the polyimide and the catalyst when the polyimide is flame treated to improve the catalyst receptivity and adhesion of the metal to the substrate.

BRIEF DESCRIPTION OF THE PRESENT INVENTION

It has now been discovered that a polyimide surface can be activated or sensitized, these two words being used as synonyms, by flame such as by a natural gas flame but not heat and the thus activated surface can be used as a surface which readily accepts, in a tightly adhering fashion, a catalytic outline from a catalyst solution which catalytic outline is especially suitable for deposition of a metal electrolessly from a bath in which the metal is in solution (electroless bath).

The flame sensitization of the polyimide renders the process very much faster, the receptivity of the catalyst is outstanding and the adhesion between the substrate and the electroless metal when the metal is deposited from the electroless bath is of very good quality. Circuit patterns obtained in accordance with the present method have good definition and provide a ready means for depositing, electrolytically on the same, the desired thickness of a subsequent metal sought to be deposited. It appears that flame sensitization is unique with polyimide polymers.

With reference to the drawings herein which illustrate facets of the present invention, these are for the purpose to aid the understanding of the invention and wherein FIG. 1 depicts the process as carried out in a disclosed sequence showing work stations up to an electrolytic deposition of a metal; and FIG. 2 depicts a representative circuit pattern produced by means of the present invention.

Turning now to FIG. 1 and the process depicted therein, roller 9 has a wound up supply of polyimide film 10 thereon which film is placed under a continuously moving mask 11 moving between the guide rollers 12. A circuit pattern, (not shown in FIG. 1, a representative pattern is shown in FIG. 2) is outlined on the mask, the film is then exposed to a flame 16, which through the apertures and openings of the circuit pattern, sensitizes the polyimide film 10. The thus sensitized film is then, by means of guide roller 17 introduced in a container 18 holding a solution 20 of a catalyst. An appropriate distance between the guide rollers 19, rotating in the tank 18, can provide for the necessary time period by which the exposure of the film to the catalyst solution 20 is controlled. If a separate sensitizer and then activator solution is used as further described herein, then an additional tank (not shown) such as 18 (with all the attendant rollers and rinse tanks) is provided. After film 10 leaves the catalyst solution in a tank 18, it is rinsed in a dionized water rinse station depicted by guide roller 21, 24, and the rinse roller 23, the latter may be a perforated cylinder through which the deionized water is being expelled. If need be, additional squeeze rollers may be introduced (not shown) which remove the ionized water before film 10 is introduced into container 25 holding a bath from which a metal is electrolessly deposited on the film 10. Again, the distance between guide roller 19 in container 25 may be varied so as to provide for the necessary time period the film resides in the electroless bath 26. Similarly, an appropriate temperature control means (not shown) can be introduced into the containers, e.g., 18 and 25 so as to control the bath and the rate of deposition of the metal.

In FIG. 2, a representative lead frame circuit of a circuit pattern 27 is shown in film 10. It consists of lead frame outline 28, spider legs 29, and leads 30. An integrated circuit (not shown) is placed in the center part of the frame 31 and connected via leads 30 to another circuit. Clamping lines 32 define the places which are used for holding the frame in a final circuit assembly. After a circuit such as circuit 27 is removed from the electroless solution 26, it may be appropriately rinsed and then dried or thereafter introduced into an electrolytic bath, if necessary, for the further deposition of metal on the pattern.

Returning now to the moving mask 11, which contains a pattern such as shown in FIG. 2, it may be made of metal or a very heat resistant polymer material capable of resisting a flame 16 which is generally at a temperature of natural gas flame, i.e. natural gas commonly piped for household or industrial use. City gas, i.e., reformed gas can also be used as long as the active flame touches the polyimide polymer surface without affecting the dimensional stability of same.

By "dimensional stability" is meant the non-degradation by shrinkage, or curling of the film so that it no longer is useful for flat flexible circuitry use. Obviously, some slight change in dimensions is tolerable.

Circuit pattern 27 depicted in FIG. 2 can be obtained when the substrate is sensitized as illustrated herein.

With reference to the polyimide films which may be used, a general disclosure of the polyimide films is found in U.S. Pat. No. 3,436,372 and the references mentioned therein. These polymers are also described in Lee et al, *New Linear Polymers*, McGraw-Hill, N.Y., N.Y. (1967). The polyimides are preferred, but polyimides-amides may also be considered. This patent and the disclosed polyimide polymers are incorporated by reference herein. The polyimide acid units and the polyimide units are well known and these substrates are obtainable in various forms, primarily as a film form known as "Kapton" or H-film. Polyimide materials are resistant to high temperatures but unexpectedly have been found to be capable of sensitizing by a flame such as a natural gas, reformed city gas at the flame temperatures encountered with these gases.

The exposure time is governed by the non-degradation or dimensional stability criteria previously outlined above.

As previously mentioned, mask 11 can be made of a metal although it is possible to make it of another polyimide film because sufficient cooling can be assured as the film is rotated around its rotating path defined by the two rollers in FIG. 1. If necessary, cooling may be provided to the mask. It has been found that a metal mask is suitable and the patterns thereon can be readily punched or produced by other means such as localized etching or cutting devices well known to those in the tool and die arts.

As the sensitized area retains its sensitization for a sufficient period to allow transport of the film and exposure to the catalyst solution in a continuous sequence it can readily be perceived that the introduction of the film (or another suitable substrate) in a catalyst solution should be as part of the overall process scheme.

With reference to the sensitized areas, these are thereafter exposed for deposition of a catalyst in a solution comprised of palladous chloride, stannous chloride, stannic and hydrochloric acid of a composition shown below.

The catalyst is then deposited on the sensitized areas and it forms sites upon which the metal from an electroless bath can be deposited. After the thus catalyzed surface is removed from the catalyst solution, it is rinsed in a deionized water bath. Generally, the catalyst pick up is achieved with a catalyst solution which contains from 0.1 mg to 4 gm/liter of Pd (metal concentration), generally about 0.1 to 1 gm/liter of Pd.

Whenever in the previous discussion the term "catalyst" was employed it was intended to cover the palladium salt or ligands thereof as a solution or dispersion in a suitable medium. Some commercial solutions of the catalyst are available wherein the catalyst is described as an "activator". Hence, a catalyst and an activator may be synonymous terms. A suitable sensitizer of the film to render the film catalytically active by reducing the catalyst to a metal is then called a "sensitizer." Generally sensitizers are stannous chloride in either an acid or a base medium. Colloidal tin, stabilized in an appropriate solution is also used.

With reference to the above, a catalyst may be a palladium chloride, silver nitrate, or gold chloride system as described above. Of these palladium chloride is far and away the preferred catalyst as the flame sensitized film does not require the supplemental sensitizer which may be needed with the other catalysts.

However, the flame sensitized film is very advantageously used with a sensitizer and activator formulations as given below.

| Sensitizer Formulations: | | |
|---|---|---|
| I. | Stannous Chloride | 100 gm/l |
| | Sodium Hydroxide | 150 gm/l |
| | Sodium Potassium Tartrate | 172 gm/l |
| II. | Stannous Chloride | 10 gm/l |
| | Hydrochloric Acid | 40 ml/l |
| Activator Formulations: | | |
| I. | Silver Nitrate | 1–10 gm/l |
| | Ammonium Hydroxide | 10–20 ml/l |
| II. | Palladium Chloride | 0.1–1 gm/l |
| | Hydrochloric Acid | 5–10 ml/l |
| III. | Gold Chloride | 0.5–1.0 gm/l |
| | Hydrochloric Acid | 10 ml/l |

The catalyst is used in a single or two step application either depositing the palladium chloride formulation (preferred) or by first depositing the sensitizer and then the activator.

Generally, in an electroless bath, the deposition of additional metal (which allows electrolytic deposition on the circuit pattern) is for 2 to 20 minutes generally from 3 to 5 minutes or until a thickness of 6 to 20 micro inches of high integrity copper or nickel is achieved.

A suitable background material for other catalysts is disclosed in U.S. Pat. No. 3,562,005 which patent is incorporated by reference herein.

As mentioned before, after the catalyzed surface has been rinsed, it is introduced in the electroless plating solution in tank 25 shown in FIG. 1, the solution being depicted as 26. Suitable solutions are:

| Electroless Coppers: | | |
|---|---|---|
| I | Copper Sulphate | 10 gm/l |
| | Sodium Hydrozide | 10 gm/l |
| | Formaldehyde (37–41% W/V) | 10 ml/l |
| | Sodium Potassium Tartrate | 50 gm/l |
| II. | Cupric Oxide | 3.0 gm/l |
| | Sodium Hypophosphite | 10 gm/l |
| | Ammonium Chloride | 0.1 gm/l |
| III. | Copper Sulphate | 13.8 gm/l |
| | Sodium Potassium Tartrate | 69.2 gm/l |
| | Sodium Hydroxide | 20 gm/l |
| | Formaldehyde (36% W/V,* 12.5% CH$_3$OH) | 40 ml/l |
| | 2-Mercaptobenzothiazole | 0.003% |
| | *weight by volume | |
| | Bath Temp: Ambient | |
| Electroless Nickel: | | |
| I. | Nickel Chloride | 80 gm/l |
| | Sodium Citrate | 100 gm/l |
| | Ammonium Chloride | 50 gm/l |
| | Sodium Hypophosphite | 10 gm/l |
| | Bath Temp: 180°F ± 20 | |
| II. | Nickel Chloride Hexahydrate | 20 gm/l |
| | Ethylene Diamine (98%) | 45 gm/l |
| | Sodium Hydroxide | 40 gm/l |
| | Sodium Borohydride | 0.67 gm/l |
| | Bath Temp: 180°F | |
| Electroless Cobalt: | | |
| I. | Cobalt Chloride Hexahydrate | 30 gm/l |
| | Sodium Citrate Pentahydrate | 35 gm/l |
| | Ammonium Chloride | 50 gm/l |
| | Sodium Hopophosphite,Monohydrate | 20 gm/l |
| II. | Cobalt Sulphate, Heptahydrate | 24 gm/l |
| | Ammonium Sulphate | 40 gm/l |
| | Sodium Hypophosphite | 20 gm/l |
| | Sodium Citrate | 80 gm/l |
| | Sodium Lauryl Sulphate | 0.1 gm/l |
| | Bath Temp: 180°F | |

Other baths which were tried and worked were Shipley NL-63 (a nickel bath), Richardson-NIKLAD 759-A (nickel); Shipley XP7006 (nickel).

Representative electroless copper baths which were used are the following: Dynachem 240; Shipley 328Q; McDermid 9055.

Some of the illustrated baths are well known in the art and reference may be had to U.S. Pat. Nos. 3,095,309 and 3,546,009 which disclose electroless copper deposition baths and to Brenner, "Metal Finishing" November 1954, pages 68 to 76, which disclose electroless nickel baths. Electroless gold baths are disclosed in U.S. Pat. Nos. 3,123,484; 3,214,292; and 3,300,328, the disclosure of which is incorporated by reference. Typically, the electroless metal baths comprise a source of the metal ions, a reducing agent for those ions, a complexing agent and a compound for pH adjustment.

With respect to the above baths, the alkali baths are a second choice when using the polyimides; an acid or neutral electroless bath is preferred.

Nickel alone may be deposited from the electroless bath or it may be immediately thereafter overplated with copper. Thereafter, nickel may be electrolytically overplated with the necessary material in a suitable electrolytic bath as it is well known in the art.

In the event copper is being plated on the top of nickel as mentioned before, nickel and palladium chloride combination achieves the necessary adhesion found to be so advantageous. Copper then can be electrolessly and electrolytically overplated and does not exhibit the blistering and adhesion problems sometimes encountered.

In addition to the continuous operation such as shown in FIG. 1, the polyimide in a form of a film or sheets or boards may be sensitized in a step-and-index fashion. However, in this event, the flame 16 is moved across the surface to be sensitized and the surface is held steady (or moved at a slower rate) which can readily be accomplished by means known in the art. Thereafter, the thus sensitized surface is exposed to the catalytic solution, rinsed and immersed or treated in the electroless solution. When a circuit device, such as a circuit board or lead frame is processed in the above described manner, it may also be appropriately mounted on a carrying belt which can be used for the indexing operation.

With respect to electrolytic deposits which are employed to build up the circuit patterns electrolytically, the following baths are suitable:

| | | |
|---|---|---|
| a. | Copper Sulfate | 28.0 oz./gal |
| | Sulfuric Acid | 7.0 oz./gal |
| | Room Temp. Bath | (15 to 25°C |
| | ASF (amperes per square foot) | about 10 |
| or: | | |
| b. | Copper Fluoroborate | 60 oz./gal |
| | Copper (as metal) | 16 oz./gal |
| | Temp. of Bath — 120°F | |
| or: | | |
| c. | Copper Cyanide | 2–3.5 oz./gal |
| | Sodium Cyanide | 3.7–5.9 oz./gal |
| | Free Sodium Cyanide | 1.5–2.0 oz./gal |
| | Sodium Hydroxide | 0–1/2 oz./gal |

Further, tin may be overplated for better solder adhesion. Typical tin, as well as tin-lead electrolytic compositions, are listed in "Metals Finishing Guidebook Directory", Metal and Plastic Publications, Inc., Westwood, New Jersey (published annually). This publication also provides sufficient description of various other electrolytic compositions suitable for flat and/or flexible circuitry uses (as well as electroless baths).

In accordance with the above method and when the circuit pattern on a Kapton (H-film, i.e., polyimide) was overplated with the electrolytic copper deposit from bath a. above, peel strength (90° peel test) values of as high as 4.5 psi have been observed for a one mil film with a one mil overplate.

Moreover, the polyimide film and circuit meets a solder dip test of 5 to 10 sec. (immersion of the circuit in a liquid solder at temperatures of 210°C to 220°C).

What is claimed is:

1. A process for depositing an electroless metal on a polyimide, the steps comprising:
   a. masking a selected area on a polyimide surface;
   b. exposing unmasked portions of said polyimide surface to an open flame;
   c. contacting said unmasked and flame sensitized surfaces of said polyimide with a catalyst solution whereby a catalytic amount of a catalyst is deposited on said catalyzed polyimide; and
   d. depositing on said catalyzed polyimide surface a metal from an electroless bath solution.

2. The process as defined in claim 1 and wherein the catalyst solution is a solution comprised of palladous chloride, stannous chloride, stannic chloride, and hydrochloric acid.

3. The process as defined in claim 1 and wherein masking of the polyimide surface is by a continuously moving flame resistant mask, said flame resistant mask being moved in unison with said polyimide surface.

4. The process as defined in claim 3 wherein the flame resistant mask is a continuous metal belt having a circuit pattern thereon at repeating intervals.

5. The process as defined in claim 1 wherein the masking is with a flame resistant continuously moving mask and a continuously fed polyimide film of a thickness of 1 to 5 mils.

6. The process as defined in claim 1 wherein said polyimide film in the unmasked portions thereof is exposed to a flame from a natural gas flame.

7. The process as defined in claim 6 wherein the polyimide surface is exposed to a butane and air combustion flame.

8. The process as defined in claim 1 wherein the polyimide surface sensitized by said flame is exposed to a catalytic solution comprising palladous chloride and hydrochloric acid, and an accelerator for said palladous chloride, said sensitized surface being exposed to said catalytic solution wherein palladium as a metal is of a concentration of 0.1 to 4 gr/liter.

9. The process as defined in claim 8 wherein the concentration of the solution is 0.1 to 1 gr/liter of Pd as a metal and the contacted catalyst solution is thereafter rinsed from said polyimide surface with deionized water.

10. The process as defined in claim 1 wherein nickel in an electroless bath is exposed to said catalyzed surfaces.

11. The process as defined in claim 10 and wherein nickel is deposited on said catalyzed polyimide film in a thickness of 5 to 10 micro inches and thereafter said nickel deposit built up with an electrolytically deposited copper layer.

12. The process as defined in claim 1 wherein the catalyzed surface is exposed to a copper, nickel, cobalt or gold in solution in an electroless bath.

13. The process as defined in claim 1 wherein electrolessly copper is deposited.

14. The process as defined in claim 1 wherein electrolessly cobalt is deposited.

15. The process as defined in claim 1 wherein electrolessly gold is deposited.

* * * * *